(12) United States Patent
Smith

(10) Patent No.: US 6,906,395 B2
(45) Date of Patent: Jun. 14, 2005

(54) HERMETICALLY SEALED SILICON MICRO-MACHINED ELECTROMECHANICAL SYSTEM (MEMS) DEVICE HAVING DIFFUSED CONDUCTORS

(75) Inventor: Stephen C. Smith, Everett, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/226,518

(22) Filed: Aug. 22, 2002

(65) Prior Publication Data

US 2003/0038327 A1 Feb. 27, 2003

Related U.S. Application Data

(60) Provisional application No. 60/314,691, filed on Aug. 24, 2001.

(51) Int. Cl.[7] .............................................. H01L 29/82
(52) U.S. Cl. ....................................... 257/417; 257/416
(58) Field of Search ................................. 257/416, 417

(56) References Cited

U.S. PATENT DOCUMENTS

| 4,023,562 A | 5/1977 | Hynecek et al. |
| 4,291,293 A | 9/1981 | Yamada et al. |
| 4,295,115 A * | 10/1981 | Takahashi et al. ............. 338/4 |
| 4,945,765 A | 8/1990 | Roszhart ....................... 73/517 |
| 5,006,487 A | 4/1991 | Stokes ........................ 437/228 |
| 5,243,861 A | 9/1993 | Kloeck et al. |
| 5,334,901 A | 8/1994 | Albert et al. ................ 310/321 |
| 5,456,110 A | 10/1995 | Hulsing, II .............. 73/514.38 |
| 5,456,111 A | 10/1995 | Hulsing, II .............. 73/514.32 |
| 5,559,290 A | 9/1996 | Suzuki et al. |
| 5,591,679 A * | 1/1997 | Jakobsen et al. ............. 438/51 |
| 5,866,469 A * | 2/1999 | Hays ........................... 438/456 |
| 5,948,981 A | 9/1999 | Woodruff .................. 73/514.29 |
| 5,996,411 A | 12/1999 | Leonardson et al. ...... 73/514.29 |
| 6,074,891 A * | 6/2000 | Staller .......................... 438/53 |
| 6,119,520 A | 9/2000 | Woodruff .................. 73/514.29 |
| 6,346,742 B1 * | 2/2002 | Bryzek et al. ............... 257/704 |
| 6,428,713 B1 | 8/2002 | Christenson et al. .......... 216/2 |

FOREIGN PATENT DOCUMENTS

| EP | 0 742 581 A2 | 11/1996 |
| EP | 1 096 260 A1 | 5/2001 |

* cited by examiner

*Primary Examiner*—Howard Weiss
(74) *Attorney, Agent, or Firm*—Charles J. Rupnick Attorney at Law

(57) ABSTRACT

The present invention is an apparatus and method for a micro-machined electromechanical system (MEMS) device having a hermetically sealed sensor or actuator device mechanism that is electrically interconnected by diffused conductive paths to a plurality of wire bond pads that are located external to the hermetic seal.

20 Claims, 2 Drawing Sheets

HERMETICALLY SEALED SILICON MICRO-MACHINED ELECTROMECHANICAL SYSTEM (MEMS) DEVICE HAVING DIFFUSED CONDUCTORS

This application claims the benefit of U.S. Provisional Application Ser. No. 60/314,691, filed in the name of Stephen Smith on Aug. 24, 2001, the complete disclosure of which is incorporated herein by reference.

FIELD OF THE INVENTION

The present invention relates generally to devices fabricated as micro-machined electromechanical systems (MEMS) and methods for manufacturing the same, and in particular to hermetically sealed MEMS devices and methods for hermetically sealing MEMS devices.

BACKGROUND OF THE INVENTION

Many devices fabricated as micro-machined electromechanical systems (MEMS), both sensor and actuator devices, and methods for manufacturing the same are generally well-known. See, for example, U.S. Pat. No. 6,642,067, METHOD OF TRIMMING MICRO-MACHINED ELECTROMECHANICAL SENSORS (MEMS) DEVICES, the complete disclosure of which is incorporated herein by reference, that describes a MEMS acceleration sensor and method for manufacturing the same. In another example, U.S. Pat. No. 6,428,713, MEMS SENSOR STRUCTURE AND MICROFABRICATION PROCESS THEREFORE, issued to Christenson, et al. on Aug. 6, 2002, which is incorporated herein by reference, describes a capacitive acceleration sensor formed in a semiconductor layer as a MEMS device. Other known MEMS devices include, for example, micro-mechanical filters, pressure sensors, gyroscopes, resonators, actuators, and rate sensors, as described in U.S. Pat. No. 6,428,713.

Vibrating beam acceleration sensors formed in a silicon substrate as MEMS devices are also generally well-known and are more fully described in each of U.S. Pat. No. 5,334,901, entitled *VIBRATING BEAM ACCELEROMETER*; U.S. Pat. No. 5,456,110, entitled *DUAL PENDULUM VIBRATING BEAM ACCELEROMETER*; U.S. Pat. No. 5,456,111, entitled *CAPACITIVE DRIVE VIBRATING BEAM ACCELEROMETER*; U.S. Pat. No. 5,948,981, entitled *VIBRATING BEAM ACCELEROMETER*; U.S. Pat. No. 5,996,411, entitled *VIBRATING BEAM ACCELEROMETER AND METHOD FOR MANUFACTURING THE SAME*; and U.S. Pat. No. 6,119,520, entitled *METHOD FOR MANUFACTURING A VIBRATING BEAM ACCELEROMETER*, the complete disclosures of which are incorporated herein by reference. Such vibrating beam accelerometers have been fabricated from a body of semiconductor material, such as silicon, using MEMS techniques. Existing techniques for manufacturing these miniature devices are described in U.S. Pat. No. 5,006,487, entitled *METHOD OF MAKING AN ELECTROSTATIC SILICON ACCELEROMETER*, and U.S. Pat. No. 4,945,765, entitled *SILICON MICROMACHINED ACCELEROMETER*, the complete disclosures of which are incorporated herein by reference.

As is generally well-known, a typical MEMS device, whether a sensor or an actuator, has a size on the order of less than $10^{-3}$ meter, and may have feature sizes of $10^{-6}$ to $10^{-3}$ meter. Moving parts within a device are typically separated by microscopically narrow critical gap spacings, and as such are highly sensitive to particle contamination, such as dust and other microscopic debris. MEMS devices are also sensitive to contamination arising from corrosive environments; humidity and $H_2O$ in either the liquid or vapor phase, which may cause stiction problems in the finished device; and mechanical damage such as abrasion. MEMS devices are often required to operate at a particular pressure or in a vacuum; or in a particular liquid or gas such as, for example, dry nitrogen; and in different acceleration environments from high-impact gun barrel munitions to zero gravity deep space applications. Such application environments aggravate the device sensitivity to contamination.

The manufacture of MEMS devices includes many individual processes. Each of the individual processes may expose the device to a source of contamination. This sensitivity to particle contamination poses a challenge to the structural design and microfabrication processes associated with these small-scale, intricate and precise devices in view of the desire to have fabrication repeatability, fast throughput times, and high product yields from high-volume manufacturing. MEMS devices are typically encapsulated and hermetically sealed within a microshell, i.e., between cover plates. The microshell serves many purposes, including shielding the micro-mechanical parts of the MEMS device from damage and contamination.

Traditionally, MEMS devices utilize a wafer stack or "sandwich" design of two or three stacked semiconductor silicon wafers, with the sensor or actuator device mechanism wafer being positioned in the center between two outside cover wafers or "plates" in a three-wafer device. In a two-wafer device, a single cover plate is mounted on top of the mechanism wafer. The cover plates are bonded to the mechanism wafer in a three dimensional MEMS device. A frit glass seal or another mechanism bonds the cover plates to the mechanism wafer along their common outer edges or peripheries and hermetically seals the device. Other common bonding mechanisms include, for example, eutectic metal-to-metal bonding, silicon-to-silicon fusion bonding, electrostatic silicon-to-silicon dioxide bonding, and anodic bonding for silicon-to-glass bonds. These conventional bonding mechanisms also result in a hermetically sealed device. The cover plate wafer or wafers act as mechanical stops for movable portions of the mechanism wafer, thereby protecting the mechanism wafer from forces that would otherwise exceed the device's mechanical limits.

Electrical connections to the sensitive portions of the mechanism wafer require one or more bond wires that pass through window apertures in one cover plate and connect to conductive paths formed on the surface of the mechanism wafer. These conductive paths and the corresponding windows in the cover plate have traditionally been located within the interiors of the respective mechanism and cover wafers, thus being interior of the seals that bond the cover plates to the mechanism wafer along their respective peripheral edges. These internal windows can allow particulate contamination or moisture to invade the interior of the MEMS device during handling, transportation, testing or wire bonding operations, which can result in premature failure.

SUMMARY OF THE INVENTION

The present invention overcomes limitations of the prior art by providing a hermetically sealed MEMS actuator or sensor device and methods for hermetically sealing MEMS devices.

According to one aspect of the invention, a MEMS device is provided having an electromechanical sensor or actuator device mechanism that is micro-machined in a semiconductor silicon wafer; an electrical signal carrier that is interconnected to the electromechanical device mechanism, the signal carrier comprising proximate and distal portions residing on a surface of the semiconductor silicon wafer and being interconnected by a third portion diffused into the surface of the semiconductor silicon wafer; and cover plates that are bonded to opposing surfaces of the semiconductor silicon wafer, one of the cover plates covering the device mechanism and the proximate portion of the signal carrier and partially covering the diffused portion of the signal carrier.

According to another aspect of the invention, the cover plate covering the device mechanism and the proximate portion of the signal carrier and partially covering the diffused portion of the signal carrier includes a window aperture exposing the distal portion of the signal carrier.

According to another aspect of the invention, the diffused portion of the signal carrier is a channel of dopant diffused into the surface of the semiconductor silicon wafer.

According to another aspect of the invention, the dopant is one of a p-type dopant and a n-type dopant selected as a function of the semiconductor silicon wafer respectively being either a n-type wafer and a p-type wafer.

According to another aspect of the invention, a contact window aperture is opened over opposite ends of the channel between the diffused dopant and the respective proximate and distal portions of the signal carrier.

According to another aspect of the invention, the proximate and distal portions of the signal carrier are metal electrical conductors.

According to still another aspect of the invention, the invention provides a method for fabricating a micro-machined electromechanical system (MEMS) actuator or sensor device, the method including: micro-machining an electromechanical actuator or sensor device mechanism in a semiconductor silicon wafer; diffusing a channel of electrically conductive impurities into one surface of semiconductor silicon wafer between the device mechanism and a portion of the semiconductor silicon wafer remote from the device mechanism; depositing first and second metallic electrical conductors on the surface of the semiconductor silicon wafer, the first metallic electrical conductor being deposited in electrical contact with the channel of electrically conductive impurities and the device mechanism, and the second metallic electrical conductor being deposited in the remote portion of the semiconductor silicon wafer and in electrical contact with the channel of electrically conductive impurities.

In a two-wafer device, micro-machining a cover plates sized to cover the device mechanism and at least the first metallic electrical conductor and a portion of the channel of electrically conductive impurities; and hermetically sealing the device mechanism to the cover plate, with the cover plate further exposing at least a portion of the second metallic electrical conductor.

In a three-wafer device, micro-machining first and second cover plates sized to cover the device mechanism, the first cover plate being further sized to at least cover the first metallic electrical conductor and a portion of the channel of electrically conductive impurities; and hermetically sealing the device mechanism between the first and second cover plates, the first cover plate further exposing at least a portion of the second metallic electrical conductor.

According to another aspect of the invention, the diffusing of a channel of electrically conductive impurities into one surface of semiconductor silicon wafer involves diffusing the impurities to a predetermined depth.

According to another aspect of the invention, the diffusing of a channel of electrically conductive impurities into one surface of semiconductor silicon wafer includes diffusing one of p-type dopants and n-type dopants as a function of a base material forming the semiconductor silicon wafer.

According to another aspect of the invention, depositing the first and second metallic electrical conductors in electrical contact with the channel of electrically conductive impurities includes providing a contact window at each end of the channel.

According to another aspect of the invention, micro-machining the first cover plate includes micro-machining a window aperture therein; and sealing the device mechanism between the first and second cover plates with the first cover plate further exposing at least a portion of the second metallic electrical conductor includes aligning the window aperture with the second metallic electrical conductor.

According to yet another aspect of the invention method of the invention, sealing the device mechanism between the first and second cover plates includes adhesively, electrostatically, or otherwise hermetically bonding the first and second cover plates to the opposite sides of the semiconductor silicon wafer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for a micro-machined electromechanical system (MEMS) device having a hermetically sealed sensor or actuator device mechanism that is electrically interconnected by diffused conductive paths to a plurality of wire bond pads that are located external to the hermetic seal.

The Figures illustrate by example and without limitation the combined diffused conductive paths, overlying sealing bond and peripheral pass-through cover windows of the invention embodied in a MEMS sensor or actuator device 100 which is, for example, a capacitive or vibrating beam acceleration sensor or another MEMS device such as a micro-mechanical filter, a pressure sensor, a gyroscope, a resonator, an actuator, or a rate sensor, the basic art of which are all generally well-known, or another MEMS sensor or actuator device.

Figure 1:
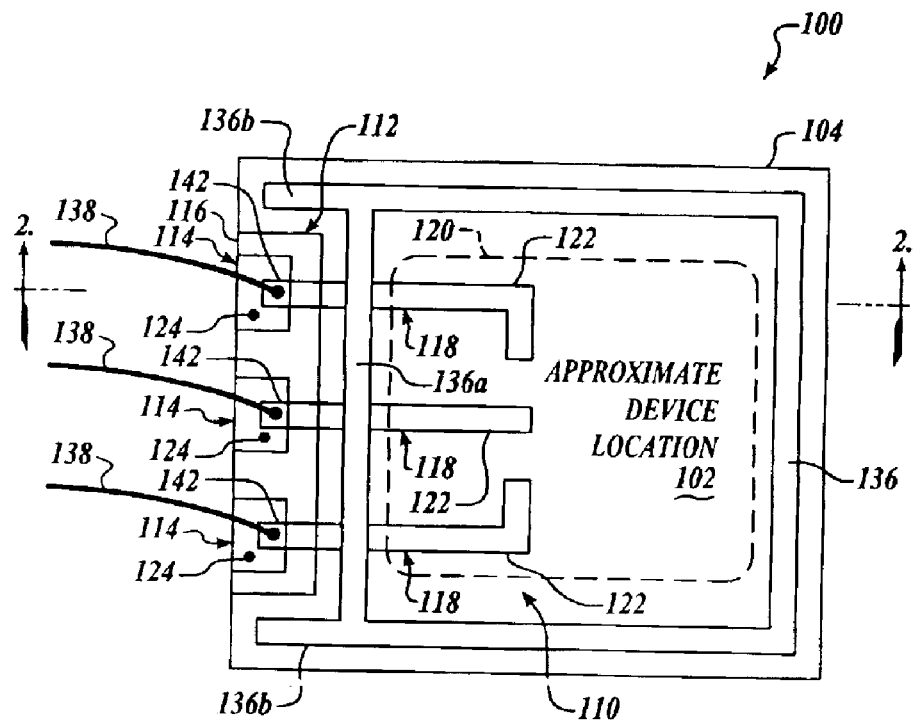
FIG. 1 is a plan view of a micro-machined electromechanical system (MEMS) sensor or actuator device of the invention having its upper or top cover plate removed for clearer viewing.
Figure 2:
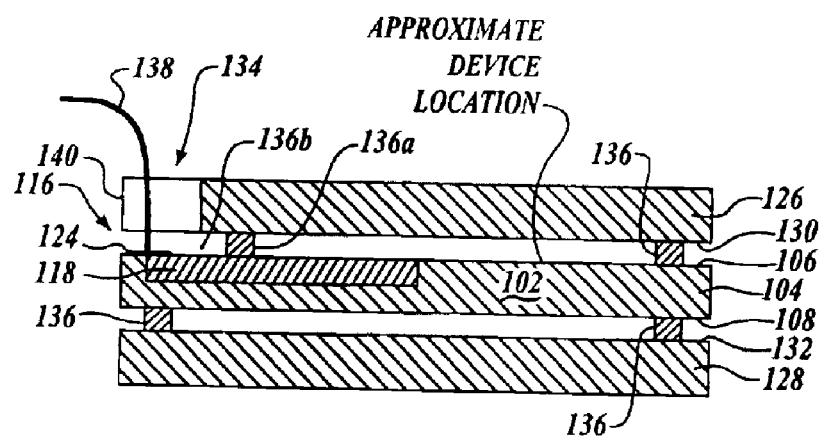
FIG. 2 is a cross-sectional side view of the MEMS device of FIG. 1.

FIGS. 1 and 2 are plan and cross-sectional side views, respectively, of the MEMS device 100 having the diffused conductive paths and overlying sealing bond of the invention embodied therein. In FIG. 1 the MEMS device 100 is shown open, i.e., without its top cover. The MEMS device 100 includes a MEMS sensor or actuator device mechanism, indicated generally at 102, that is formed in an interior portion of a mechanism wafer 104, which is a semiconductor silicon wafer having substantially planar and parallel spaced apart top and bottom surfaces 106, 108. One or more electrical conductors 110 are electrically interconnected to the device mechanism 102 and extend outwardly to a remote portion 112 of the silicon wafer that is spaced away from the device mechanism 102. According to one embodiment of the invention, a quantity of the electrical conductors 110 all extend to spaced apart positions 114 adjacent to one peripheral edge 116 of the mechanism wafer 104.

The electrical conductors 110 each include bridge portion 118 formed of a quantity of electrically conductive dopant material diffused within the top surface 106 of the mechanism wafer 104. The bridge portion 118 of each electrical conductor 110 extends between the remote portion 112 of the mechanism wafer 104 adjacent to the peripheral edge 116 and an interior portion 120 of the mechanism wafer 104 where the device mechanism 102 is located. Each of the electrical conductors 110 is interconnected in electrical contact with both the device mechanism 102 and a portion of the bridge 118 that is extended into the interior portion 120 of the mechanism wafer 104 and coupled to the device mechanism 102. The electrical conductors 110 also include conventional metal wire bond pads 124 that are positioned on the top surface 106 of the mechanism wafer 104 at the spaced apart remote positions 114 adjacent to the peripheral edge 116. The electrical conductors 110 thus provide remote electrical access to the device mechanism 102, with the diffused electrically conductive material forming an electrical bridge 118 beneath the surface of the mechanism wafer 104.

As illustrated in FIG. 2, top and bottom (if present) cover wafers or "plates" 126, 128 are bonded or otherwise adhered to respective top and bottom surfaces 106, 108 of the mechanism wafer 104. The cover plates 126, 128 are formed, for example, in respective semiconductor silicon wafers each having a respective substantially planar surface 130, 132 that is bonded to the respective top and bottom surfaces 106, 108 of the mechanism wafer 104 using an appropriate conventional bonding technique. Alternatively, the cover plates 126, 128 are formed in respective Pyrex® glass wafers. The top cover plate 126 is sized to cover at least both the device mechanism 102 and the electrical conductors 110. The bottom cover plate 128 (if present) is sized to cover at least the device mechanism 102 itself. In practice, the MEMS device 100 is cut out after the cover plates 126, 128 have been installed, so that the three stacked semiconductor silicon wafers, i.e., the device mechanism wafer 104 and the cover plates 126, 128, are all the same size, and the mechanism wafer 104 is completely and exactly covered by the top cover plate 126 (in a two-wafer stack) and the bottom (in a three-wafer stack) cover plate 128.

Figure 3:
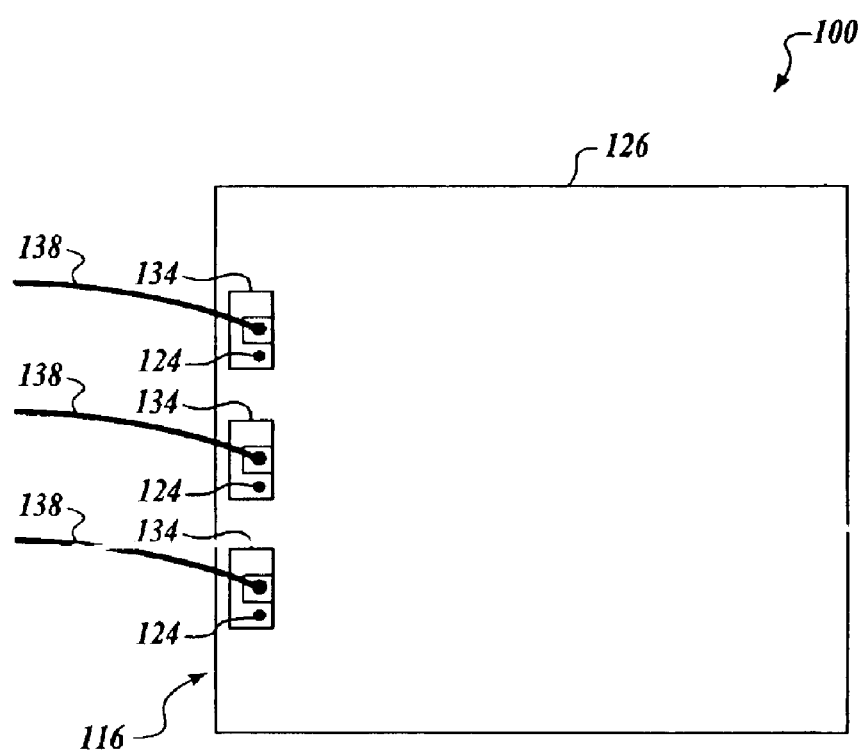
FIG. 3 is a plan view of the MEMS device of FIG. 1 having the upper or top cover plate installed.

A pass-through window aperture 134, shown also in FIG. 3, is formed in the top cover plate 126 for each wire bond pad 124. Each window aperture 134 is aligned with the corresponding wire bond pad 124 on the top surface 106 of the mechanism wafer 104 at the spaced apart remote positions 114 adjacent to the peripheral edge 116. The window apertures 134 provide access for connecting electrical wires to the bond pads 124.

A hermetic bonding mechanism 136 is provided in a pattern in between the top cover plate 126 and the top surface 106 of the mechanism wafer 104. The hermetic bonding mechanism 136 is, for example, an adhesive bonding agent in a pre-form of glass frit, a eutectic metal-to-metal bond, a silicon-to-glass anodic bond, or an electrostatic silicon-to-silicon dioxide bond, as appropriate. The pattern of the hermetic bonding mechanism 136 is external to and completely surrounds the device mechanism 102, and may include the entirety of the interior portion 120 of the mechanism wafer 104. The pattern of the bonding mechanism 136 includes a portion 136a that lies between the device mechanism 102 and the wire bond pads 124, across the subsurface electrical bridge portion 118 of the electrical conductors 110. The wire bond pads 124 along the peripheral edge 116 thus lie outside the pattern of the bond 136 surrounding the device mechanism 102. Of necessity, the window apertures 134 in the top cover plate 126 also lie outside the confines of the pattern of the bonding mechanism 136. In practice, the pattern of the bonding mechanism 136 lies adjacent to the peripheral edges of the mechanism wafer 104 and cover plate 126, thereby providing the maximum area for the device mechanism 102.

For symmetry, the bond pattern may include portions 136b that extend along the peripheral edges of the mechanism wafer 104 and cover plate 126 toward the peripheral edge 116 on either side of the remote portion 112 of the silicon wafer where the wire bond pads 124 are located.

The bottom cover plate 128 (if present) is adhered to the bottom surface 108 of the mechanism wafer 104 by the bonding mechanism 136 in another pattern provided between the two surfaces. The pattern of the bonding mechanism 136 between the mechanism wafer and bottom cover surfaces 108, 132 is external to and completely surrounds the device mechanism 102. The pattern of the bonding mechanism 136 follows the traditional pattern, whereby the bonding mechanism 136 hermetically seals the bottom cover plate 128 to the mechanism wafer 104 in a rectangular pattern along their respective peripheral edges.

FIG. 3 is a top view of the MEMS device 100 showing the window apertures 134 through the top cover plate 126 at locations that correspond to each of the metal wire bond pads 124, thereby providing access for bonding electrical wire connections 138 to the wire bond pads 124 and through the electrical conductors 110 to the device mechanism 102. The window apertures 134 are alternatively formed such that they are completely open to the peripheral edge 140 of the top cover plate 126, as shown in FIG. 2. In other words, the windows 134 are alternatively formed as slots through the edge 140 of the top cover plate.

As described herein, the aspects of the present invention, when embodied in a MEMS device, thus permit the device to be purged of all contaminants and backfilled with a dry inert gas after assembly. The bonding mechanism 136 hermetically seals the device, preventing particulate and vapor contaminates from entering the device. The diffused conductive paths 118, overlying hermetic seal 136 and peripheral pass-through windows 134 of the invention combine to permit the device to be sealed with the inert gas environment retained within its interior, i.e, surrounding the device mechanism 102. Only the small portion 112 of the mechanism wafer 104, that is adjacent to the peripheral edge 116 and remote from the device mechanism 102 and having the metal wire bond pads 124, lies outside the hermetic bond 136 and remains exposed to the ambient environment.

The Process

The invention is practiced in a clean room environment, utilizing the following materials and equipment. The materials utilized include silicon wafers for fabrication of the mechanism and cover plates and a dopant, i.e., impurity such as either n-type (negative) or p-type (positive) selected as a function of the base material of the selected silicon wafers, typically n-type dopant for forming "n" channels in p-type wafers and p-type dopant for forming "p" channels in a n-type wafers. The n-type surface doping impurity is by example and without limitation: phosphorus, arsenic, or antimony. The p-type surface doping impurity is by example and without limitation: boron, aluminum, gallium, indium, or titanium. The surface doping impurity source can be solid, liquid or gas for ion implantation in a deposition furnace. The surface doping impurity source can only be gas for ion implantation using a vacuum ion accelerator. A mask, such as a quartz mask with opaque and clear areas, is used for respectively blocking and passing ultraviolet light that is utilized in a mask aligner tool for selectively exposing/ patterning photo sensitive resist film, commonly referred to as "photoresist," for patterning the silicon wafers. Oxidation and diffusion gases are used to grow silicon dioxide ($SIO_2$) or drive impurities, as follows such as hydrogen, oxygen and nitrogen.

The photo sensitive resist film is a chemical film used to protect the silicon dioxide layer during etching of the silicon wafers. A chemical photo developer is used to wash away residual photoresist. De-ionized water is used for rinsing during processing. Different cleaning chemicals, such as sulfuric acid and hydrogen peroxide, are used during processing, as are etch chemicals, such as hydrofluoric acid diluted, for etching the silicon dioxide.

Equipment utilized in practicing the invention include: an acid wet station with water cleaning capabilities and a rinser/dryer; an oxidation furnace for growing $SIO_2$; a photoresist coating system capable of applying a controlled resist film to the silicon wafer surface; a mask alignment system capable of aligning a silicon wafer to the mask and uniformly exposing resist with ultra-violet light; a photoresist development system capable of removing the residual resist; a wet station with $SIO_2$ etch capabilities and rinse/dryer; a wet station with photoresist removal capabilities; a deposition furnace for depositing "n" or "p" type dopants; a diffusion furnace capable of driving dopants into the silicon; and miscellaneous equipment such as bake ovens, microscopes, and other equipment traditionally utilized in manufacturing. MEMS devices. Additionally, practicing the invention utilizes an instrument capable of measuring surface resistance of deposited and driven dopants, and an instrument capable of measuring junction depth of diffused dopants.

The dopant deposition and drive operations are optionally practiced before the mechanism wafer is silicon etched because photolithography masking tools require a complete, flat non-perforated silicon wafer surface to be operated effectively. The impurity or dopant concentration channel target 118 is provided to closely match in resistance, capacity and capacitance the associated metal conductor paths of the electrical conductors 110, i.e., the conventional metal wire bond pads 124.

Practicing the process of the invention includes: cleaning the surface of the silicon mechanism and top and bottom (if present) cover wafers 104, 126, 128 using a sulfuric acid and hydrogen peroxide mix; growing silicon dioxide on the surface of the mechanism wafer 104 using the oxidation furnace, this includes growing enough $SIO_2$ to restrict impurities from the silicon interface; and masking the portions of the $SIO_2$ to be retained on both sides of the mechanism wafer 104 using standard coat/expose/develop photolithography techniques, while completely protecting the wafer backside $SIO_2$ with photoresist or the equivalent, and exposing the wafer front side using the opaque and clear quartz mask such that selective areas of the photoresist film are retained. The areas of the $SIO_2$ that are not protected are subsequently removed to provide the conductor paths 118. Practicing the process of the invention further includes chemically etch the exposed $SIO_2$, i.e., areas unprotected by the photo sensitive film, to complete removal using diluted hydrofluoric acid followed by a water rinse.

The photoresist, used to the protect the $SIO_2$, is chemically stripped, thereby leaving selected areas of unprotected silicon, which permits realization of the diffused conductor paths 118. The phosphorus or boron dopants or impurities are deposited, the selection of the dopant being determined as a function of the base material used in the deposition furnace. Surface resistance is measured on a test wafer to confirm the process before the dopant is driven into the silicon wafer to a predetermined depth using the diffusion furnace. Surface resistance is again measured on a test wafer to confirm the process is in accord with design parameters. Junction depth is measured on a test wafer to confirm the process is in accord with design parameters. Stripping of the $SIO_2$ is completed using hydrofluoric acid. $SIO_2$ is re-grown if a design parameter and small contact windows, shown at 142 in FIG. 1, are opened over the diffused channels 118 using conventional photoresist techniques. The protecting doped oxide layer is removed for best results.

The contact windows provide metal contact to the diffused layer at the ends of the diffused channels 118, thereby completing the conductors 110 within the silicon in preparation for the end-of-process bonding and sealing.

While the preferred embodiment of the invention has been illustrated and described, it will be appreciated that various changes can be made therein without departing from the spirit and scope of the invention.

What is claimed is:

1. A micro-machined electromechanical system (MEMS) device comprising:
    an electromechanical device mechanism that is micro-machined in a semiconductor silicon wafer;
    an electrical signal carrier comprising electrically interconnected proximate, medial and distal portions that are submerged in a surface of the semiconductor silicon wafer with the proximate portion being interconnected to the electromechanical device mechanism, the interconnected proximate, medial and distal portions of the signal carrier further comprising a channel of dopant diffused into the surface of the semiconductor silicon wafer having a portion residing on a surface of the semiconductor silicon wafer that is in communication with the surface of the semiconductor silicon wafer over substantially the entire channel length and being electrically interconnected to the submerged portion; and
    a cover plate that is bonded to the surface of the semiconductor silicon wafer having the signal carrier and is bonded to a submerged portion of the signal carrier, the cover plate being structured to cover the device mechanism and the proximate portion of the signal carrier and to partially cover the submerged portion of the signal carrier.

2. The device of claim 1 wherein the cover plate further comprises a window aperture exposing the distal portion of the signal carrier.

3. The device of claim 1 wherein the dopant further comprises a dopant that is selected as a function of a base material of the semiconductor silicon wafer.

4. The device of claim 1 wherein the proximate and distal surface portion of the signal carrier further comprises a metal electrical conductor.

5. The device of claim 1, further comprising a second cover plate that is bonded to a surface of the semiconductor silicon wafer opposite from the cover plate covering the device mechanism and partially covering the signal carrier, the second cover plate covering at least the device mechanism.

6. The device of claim 1 wherein the device mechanism further comprises one of a sensor mechanism and an actuator mechanism.

7. A micro-machined electromechanical system (MEMS) device comprising:
- a plurality of semiconductor silicon wafers each having substantially planar and parallel spaced apart surfaces and a plurality of peripheral edges;
- a micro-machined electromechanical device mechanism formed in a first of the semiconductor silicon wafer at a position spaced away from the peripheral edges;
- a metallic electrical conductor that is spaced away from the device mechanism;
- a channel of concentrated impurities realized within one surface of the first silicon wafer and that is in communication with the surface of the first silicon wafer over the entire channel length and is electrically interconnected between the device mechanism and the metallic electrical conductor;
- a top cover plate formed in a second of the semiconductor silicon wafers and having a window aperture formed therein, the top cover plate being bonded to the first silicon wafer and covering the sensor mechanism and part of the channel of concentrated impurities, with the window aperture being aligned with the spaced away metallic electrical conductor; and
- a bonding pattern realized between the top cover plate and each of the first silicon wafer and an intermediate portion of the channel of concentrated impurities between the device mechanism and the spaced away metallic electrical conductor, the bonding pattern surrounding the device mechanism and covering the intermediate portion of the channel of concentrated impurities between the device mechanism and the spaced away metallic electrical conductor.

8. The device of claim 7 wherein the channel of concentrated impurities realized within one surface of the first silicon wafer further comprises a channel of concentrated impurities that are diffused within the surface of the first silicon wafer.

9. The device of claim 8 wherein the concentrated impurities that are diffused within the surface of the first silicon wafer further comprise dopants.

10. The device of claim 9 wherein the dopants that are diffused within the surface of the first silicon wafer further comprise one of p-type dopants and n-type dopants as a function of a base material forming the first semiconductor silicon wafer.

11. The device of claim 7 wherein the top cover plate further comprises a micro-machined semiconductor silicon wafer.

12. The device of claim 7 wherein the bonding pattern further comprises one of an electrostatic bond, a eutectic bond, a fusion bond, an anodic bond, and an adhesive bond.

13. The device of claim 7 further comprising a bottom cover plate that is formed in a third semiconductor silicon wafer and that is bonded to the first silicon wafer opposite from the top cover plate and covering at least the device mechanism.

14. The device of claim 7 wherein the device mechanism further comprises one of a sensor mechanism and an actuator mechanism.

15. A micro-machined electromechanical system (MEMS) device comprising:
- a micro-machined electromechanical device mechanism formed in an interior portion of a first semiconductor silicon wafer, the silicon wafer having first and second substantially planar and parallel spaced apart surfaces;
- an electrical conductor being electrically interconnected to the device mechanism and extending to a portion of the silicon wafer remote from the device mechanism, the electrical conductor comprising:
  - a quantity of electrically conductive material diffused within the first surface of the first silicon wafer and in direct physical communication therewith and extending between the remote portion of the first silicon wafer and the sensor mechanism, and being in electrical contact with the sensor mechanism, and
  - a metal wire bond pad positioned on a surface of the first silicon wafer at the remote portion thereof and in electrical contact with a portion of the diffused conductive material positioned in the remote portion of the first silicon wafer;
- a first micro-machined cover plate formed in a second semiconductor silicon wafer having a substantially planar surface, the planar surface being bonded to the first surface of the first silicon wafer, the first cover plate being sized to cover both the device mechanism and the electrical conductor and being formed with a window aligned with the metal wire bond pad formed on the first silicon wafer; and
- a bonding pattern between the first cover plate and the first surface of the first silicon wafer, the bonding pattern being external to the device mechanism and having a portion positioned over a portion of the diffused electrically conductive material between the device mechanism and the metal wire bond pad and in direct physical communication therewith.

16. The device of claim 15 wherein the quantity of electrically conductive material diffused within the first surface of the first silicon wafer further comprises a quantity of dopant material.

17. The device of claim 16 herein the quantity of dopant material diffused within the first surface of the first silicon wafer further comprises a quantity of material is one of a p-type dopant and a n-type dopant.

18. The device of claim 16 wherein the dopant material further comprises one of a p-type dopant and a n-type dopant as a function of the first silicon wafer respectively comprising one of a n-type wafer and a p-type wafer.

19. The device of claim 15, further comprising a second micro-machined cover plate formed in a third semiconductor silicon wafer having a substantially planar surface sized to cover at least the device mechanism, the planar surface being bonded to the second surface of the first silicon wafer and operating in combination with the first cover plate to hermetically seal the device mechanism.

20. The device of claim 15 wherein the device mechanism further comprises one of a sensor mechanism and an actuator mechanism.

* * * * *